United States Patent
Chiu et al.

(10) Patent No.: US 12,463,620 B2
(45) Date of Patent: Nov. 4, 2025

(54) FEEDBACK CONTROL CIRCUIT OF PULSE-FREQUENCY MODULATION CONVERTER THAT ADAPTIVELY ADJUSTS ON-TIME CONTROL SIGNAL AND ASSOCIATED FEEDBACK CONTROL METHOD

(71) Applicant: Airoha Technology Corp., Hsinchu (TW)

(72) Inventors: Han-Chi Chiu, Hsinchu (TW); Jui-Hung Wei, Hsinchu (TW); Ke-Deng Huang, New Taipei (TW); John-San Yang, Hsinchu County (TW)

(73) Assignee: Airoha Technology Corp., Hsinchu (TW)

( * ) Notice: Subject to any disclaimer, the term of this patent is extended or adjusted under 35 U.S.C. 154(b) by 42 days.

(21) Appl. No.: 18/399,660

(22) Filed: Dec. 28, 2023

(65) Prior Publication Data
US 2024/0313747 A1    Sep. 19, 2024

Related U.S. Application Data

(60) Provisional application No. 63/451,649, filed on Mar. 13, 2023.

(51) Int. Cl.
*H03K 3/017* (2006.01)
*H03K 3/037* (2006.01)

(52) U.S. Cl.
CPC ............. *H03K 3/017* (2013.01); *H03K 3/037* (2013.01)

(58) Field of Classification Search
CPC .......... H03K 3/017; H03K 3/037; H03K 5/01; H03K 5/04; G05F 1/66; G05F 1/24; G05F 1/253; G05F 1/33; H02M 1/0009; H02M 3/156; H02M 3/1566; H02M 3/1563; H02M 3/157
See application file for complete search history.

(56) References Cited

U.S. PATENT DOCUMENTS

| | | | |
|---|---|---|---|
| 7,446,517 B2 | 11/2008 | Chen | |
| 7,834,606 B2 | 11/2010 | Liu | |
| 8,427,128 B2 | 4/2013 | Tsai | |
| 8,508,206 B2 | 8/2013 | Wan | |
| 10,756,627 B2 | 8/2020 | Hsu | |
| 11,394,299 B2 | 7/2022 | Lazaro | |
| 2015/0091544 A1* | 4/2015 | Jayaraj | H02M 3/156 323/284 |
| 2021/0257899 A1 | 8/2021 | Wang | |

FOREIGN PATENT DOCUMENTS

| | | |
|---|---|---|
| TW | 201444255 A | 11/2014 |
| TW | 202133538 A | 9/2021 |

* cited by examiner

*Primary Examiner* — Jung Kim
(74) *Attorney, Agent, or Firm* — Winston Hsu

(57) ABSTRACT

A feedback control circuit of a pulse-frequency modulation (PFM) converter includes an on-time timer circuit and a detection circuit. The on-time timer circuit generates an on-time control signal for controlling an on-time duration of a switch circuit included in a power stage circuit of the PFM converter. The detection circuit controls the on-time timer circuit to adaptively adjust the on-time control signal according to a pulse interval between two successive inductor current pulses of the PFM converter.

10 Claims, 8 Drawing Sheets

FEEDBACK CONTROL CIRCUIT OF PULSE-FREQUENCY MODULATION CONVERTER THAT ADAPTIVELY ADJUSTS ON-TIME CONTROL SIGNAL AND ASSOCIATED FEEDBACK CONTROL METHOD

CROSS REFERENCE TO RELATED APPLICATIONS

This application claims the benefit of U.S. Provisional Application No. 63/451,649, filed on Mar. 13, 2023. The content of the application is incorporated herein by reference.

BACKGROUND OF THE INVENTION

1. Field of the Invention

The present invention relates to a voltage converter design, and more particularly, to a feedback control circuit of a pulse-frequency modulation converter that adaptively adjusts an on-time control signal and an associated feedback control method.

2. Description of the Prior Art

Switching direct current-direct current (DC-DC) voltage converters (regulators) are commonly used to provide a regulated voltage output derived from a power source such as a battery. One common type of switching voltage converter operates as a step down regulator (buck converter) that provides an output voltage which is lower than an input voltage. The pulse-frequency modulation (PFM) mode has a very simple structure in a DC-DC buck converter, and can save chip area. In addition, the PFM control can achieve high efficiency under light-load conditions. Generally speaking, the PFM control employs a pulse train to determine an output voltage of the DC-DC buck converter. For example, a typical PFM converter employs a peak inductor current value, and enables one inductor current pulse each time the output voltage drops below a reference voltage. However, instead of altering the duty cycle of the pulse train having a fixed frequency to set the output voltage, the PFM control alters the frequency of the pulse train. As a result, electromagnetic interference (EMI) noises may be introduced by the typical PFM converter due to the fact that the switching frequency of the typical PFM converter varies. For an audio application using the typical PFM converter, it is possible that an audio band is interfered with the noise caused by the lower switching frequency of the typical PFM converter.

SUMMARY OF THE INVENTION

One of the objectives of the claimed invention is to provide a feedback control circuit of a pulse-frequency modulation converter that adaptively adjusts an on-time control signal and an associated feedback control method.

According to a first aspect of the present invention, an exemplary feedback control circuit of a pulse-frequency modulation (PFM) converter is disclosed. The feedback control circuit includes an on-time timer circuit and a detection circuit. The on-time timer circuit is arranged to generate an on-time control signal for controlling an on-time duration of a switch circuit included in a power stage circuit of the PFM converter. The detection circuit is arranged to control the on-time timer circuit to adaptively adjust the on-time control signal according to a pulse interval between two successive inductor current pulses of the PFM converter.

According to a second aspect of the present invention, an exemplary feedback control method employed by a pulse-frequency modulation (PFM) converter is disclosed. The exemplary feedback control method includes: generating an on-time control signal for controlling an on-time duration of a switch circuit included in a power stage circuit of the PFM converter; and adaptively adjusting the on-time control signal according to a pulse interval between two successive inductor current pulses of the PFM converter.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

For an audio application using the typical PFM converter, it is possible that an audio band is interfered with the noise caused by the lower switching frequency of the typical PFM converter. For example, when the load changes from a large value to a small value, the typical PFM converter decreases its switching frequency automatically. However, when the switching frequency decreases to a frequency value within the audio band (e.g., 2 Hz to 20 kHz), the noise caused by the switching frequency becomes audible. A peak inductor current value used in a feedback control loop has a minimum limit due to the slow settling time of a current sensing circuit. Hence, when the typical PFM converter operates under an ultra-light load condition (<2 mA) and a minimum peak inductor current value is already employed by the feedback control loop, a conventional solution that reduces the peak inductor current value for increasing the switching frequency is no longer feasible, and the switching frequency becomes very low. To address this issue, the present invention proposes an innovative PFM converter design which is capable of using adaptive on-time control of the power stage circuit to keep the switching frequency higher than the audio band (e.g., 2 Hz to 20 kHz) under the ultra-light load condition (<2 mA). Further details of the proposed PFM converter design are described as below with reference to the accompanying drawings.

Figure 1:
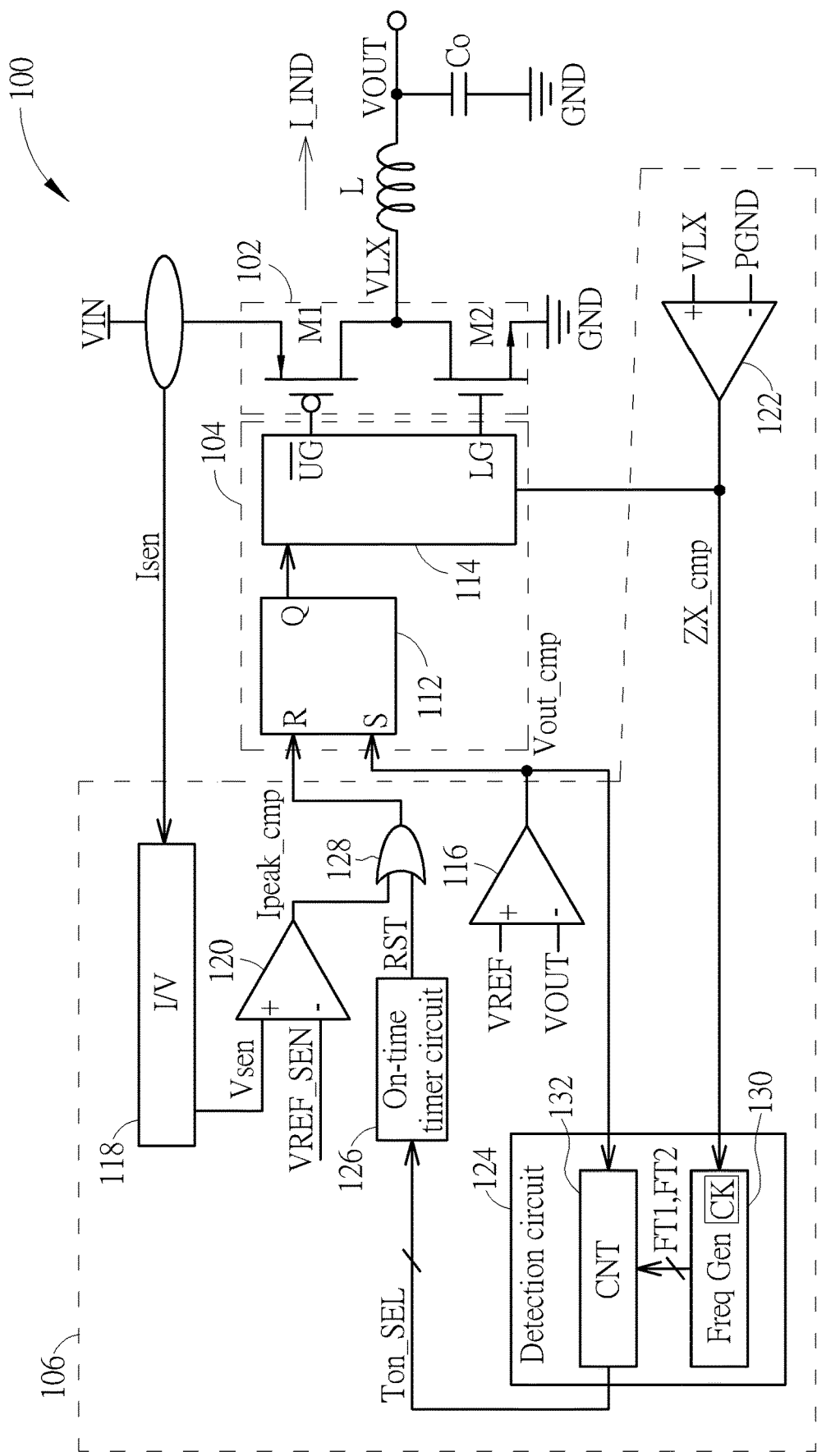
FIG. 1 is a diagram illustrating a PFM converter according to an embodiment of the present invention.

FIG. 1 is a diagram illustrating a PFM converter according to an embodiment of the present invention. The PFM converter 100 can be used as a DC-DC buck converter for regulating an output voltage VOUT according to an input voltage VIN (VOUT<VIN). By way of example, but not limitation, the PFM converter 100 may be used by an audio application, and the input voltage VIN may be supplied from a battery. The PFM converter 100 includes a power stage circuit 102, a PFM control circuit 104, a feedback control circuit 106, an inductor L, and an output capacitor Co. The power stage circuit 102 is coupled between the input voltage VIN and a reference voltage (e.g., ground voltage GND), and includes a high-side switch circuit and a low-side switch circuit. In this embodiment, the high-side switch circuit is implemented by a P-channel metal-oxide-semiconductor (PMOS) transistor M1, and the low-side switch circuit is implemented by an N-channel metal-oxide-semiconductor (NMOS) transistor M2. The PFM control circuit 104 is responsible for dealing with the PFM control. In this embodiment, the PFM control circuit 104 includes a set-reset (SR) latch circuit 112 and a switch control circuit 114. The SR latch circuit 112 includes a set input node (labeled by "S"), a reset input node (labeled by "R"), and an output node (labeled by "Q"). The operation of the SR latch circuit 112 may be represented by the following truth table, but the present invention is not limited thereto.

| S | R | Q |
|---|---|---|
| 0 | 0 | Q (Latch) |
| 0 | 1 | 0 |
| 1 | 0 | 1 |
| 1 | 1 | 0 |

The switch control circuit 114 sets the output signals $\overline{UG}$ and LG in response to an output signal of the SR latch circuit 112 or a feedback control signal ZX_cmp obtained from zero-crossing detection. The output signal $\overline{UG}$ is coupled to a gate terminal of the PMOS transistor M1, and the output signal LG is coupled to a gate terminal of the NMOS transistor M2. When the output node of the SR latch circuit 112 is set by a logic high level (i.e., Q=1), the switch control circuit 114 sets each of the output signals $\overline{UG}$ and LG by a logic low level (i.e., $\overline{UG}=\overline{Q}=0$ & LG=Q=0), such that the high-side switch circuit (PMOS transistor M1) is turned on (i.e., conducted), and the low-side switch circuit (NMOS transistor M2) is turned off (i.e., not conducted). When the output node of the SR latch circuit 112 is reset by a logic low level (i.e., Q=0), the switch control circuit 114 sets each of the output signals $\overline{UG}$ and LG by a logic high level (i.e., $\overline{UG}=\overline{Q}=1$ & LG=Q=1), such that the high-side switch circuit (PMOS transistor M1) is turned off (i.e., not conducted), and the low-side switch circuit (NMOS transistor M2) is turned on (i.e., conducted). Furthermore, when the feedback control signal ZX_cmp has a transition from the logic low level (i.e., ZX_cmp=0) to the logic high level (i.e., ZX_cmp=1), the output signal LG is reset by the logic low level (i.e., LG=0), where the output signal $\overline{UG}$ remains at the logic high level (i.e., $\overline{UG}=1$). Hence, the high-side switch circuit (PMOS transistor M1) and the low-side switch circuit (NMOS transistor M2) are both turned off (i.e., not conducted).

The feedback control circuit 106 is arranged to generate a plurality of feedback control signals that are required by the PFM control circuit 104. In this embodiment, the feedback control circuit 106 includes a plurality of comparator circuits 116, 120, 122, a current-to-voltage converter circuit (labeled by "I/V") 118, a detection circuit 124, an on-time timer circuit 126, and an OR gate 128. A sensed current signal Isen that provides information on the inductor current I_IND ($I_{sen} \cong $ I_IND) flowing through the inductor L is converted into a sensed voltage signal Vsen by the current-to-voltage converter circuit 118. That is, the sensed voltage signal Vsen is indicative of the current value of the inductor current I_IND.

The comparator circuit 120 is arranged to compare the sensed voltage signal Vsen with a peak current value VREF_SEN (which is a voltage level indicative of a peak inductor current value), and generate and output a feedback control signal Ipeak_cmp. In this embodiment, the feedback control signal Ipeak_cmp is supplied to the reset input node (labeled by "R") of the SR latch circuit 112 through the OR gate 128.

The comparator circuit 116 is arranged to compare the output voltage VOUT of the PFM converter 100 with a reference voltage VREF, and generate and output a feedback control signal Vout_cmp to the set input node (labeled by "S") of the SR latch circuit 112. In this embodiment, the feedback control signal Vout_cmp (which can act as an indicator of a start of one inductor current pulse) is further provided to the detection circuit 124.

The comparator circuit 122 is arranged to compare a voltage VLX at a connection node between the high-side switch circuit (PMOS transistor M1) and the low-side switch circuit (NMOS transistor M2) of the power stage circuit 102 with a reference voltage (e.g., power-ground voltage PGND) for zero-crossing detection, and generate and output the feedback control signal ZX_cmp to the switch control circuit 114. In this embodiment, the feedback control signal ZX_cmp (which can act as an indicator of an end of one inductor current pulse) is further provided to the detection circuit 124.

Figure 2:
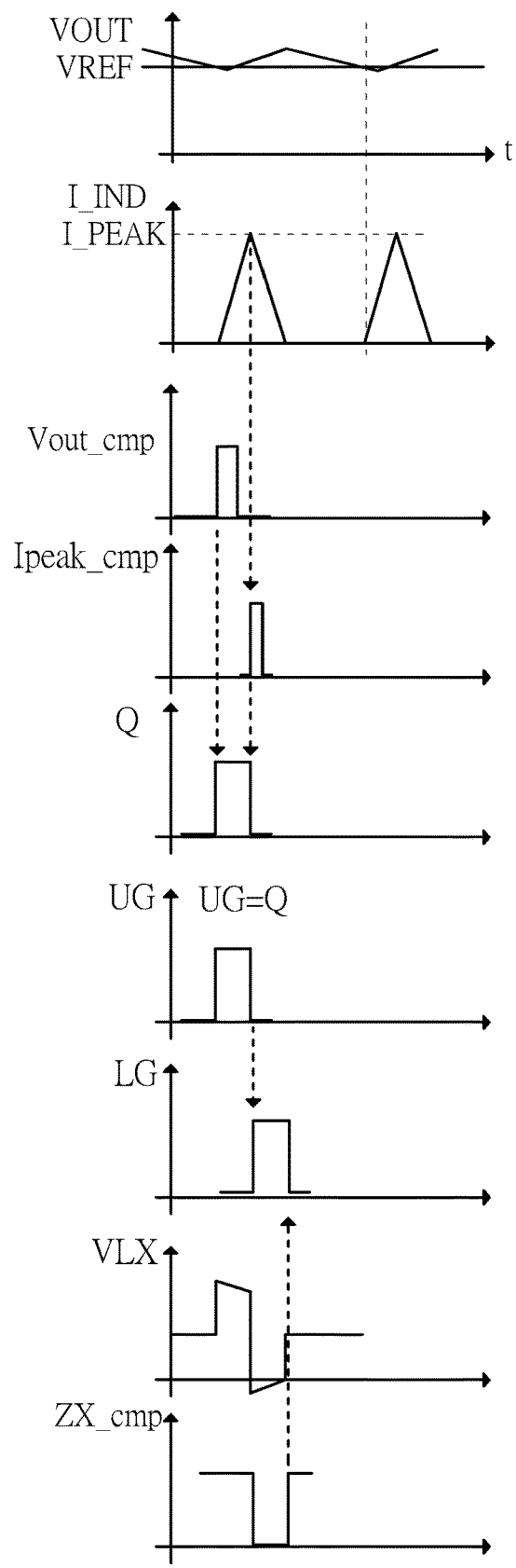
FIG. 2 is a diagram illustrating waveforms of different signals of the PFM converter shown in FIG. 1.

Please refer to FIG. 2 in conjunction with FIG. 1. FIG. 2 is a diagram illustrating waveforms of different signals of the PFM converter 100 shown in FIG. 1. The principle of the PFM control employed by the PFM converter 100 is described as below. When the output voltage VOUT drops below the reference voltage VREF (i.e., VOUT<VREF), the feedback control signal Vout_cmp is set by the logic high level (i.e., Vout_cmp=1). Hence, the output node of the SR latch circuit 112 is set by the logic high level (i.e., Q=1) in response to the set input node of the SR latch circuit 112 being asserted (i.e., S=Vout_cmp=1). Since the output node of the SR latch circuit 112 is set by the logic high level (i.e., Q=1), the high-side switch circuit (PMOS transistor M1) is turned on, and the low-side switch circuit (NMOS transistor M2) is turned off. The inductor current I_IND increases due to the turned-on high-side switch circuit (PMOS transistor M1). In addition, the voltage VLX increases at the time the inductor current I_IND starts increasing.

When the inductor current I_IND exceeds a peak inductor current value I_PEAK that makes the sensed voltage signal Vsen (which has a voltage representative of the inductor current I_IND) exceed the peak current value VREF_SEN (which is a voltage level indicative of the peak inductor current value I_PEAK), the feedback control signal Ipeak_cmp is set by the logic high level (i.e., Ipeak_cmp=1). Hence, the output node of the SR latch circuit 112 is reset by the logic low level (i.e., Q=0) in response to the reset input node of the SR latch circuit 112 being asserted (i.e., R=Ipeak_cmp=1). Since the output node of the SR latch circuit 112 is reset to the logic low level (i.e., Q=0), the high-side switch circuit (PMOS transistor M1) is turned off, and the low-side switch circuit (NMOS transistor M2) is turned on. The inductor current I_IND decreases due to the turned-on low-side switch circuit (NMOS transistor M2). At this moment, the voltage VLX becomes negative due to the fact that the inductor current I_IND should be continuous. Next, the voltage VLX increases during a period in which the inductor current I_IND decreases.

When the voltage VLX crosses over the power-ground voltage PGND, the feedback control signal ZX_cmp has a transition from the logic low level (i.e., ZX_cmp=0) to the logic high level (i.e., ZX_cmp=1), which in turn makes the switch control circuit 114 turn off the low-side switch circuit (NMOS transistor M2). Hence, both of the high-side switch circuit (PMOS transistor M1) and the low-side switch circuit (NMOS transistor M2) are turned off.

The major difference between the proposed PFM converter 100 and the typical PFM converter is that the proposed PFM converter 100 adopts an adaptive on-time control scheme to keep the switching frequency higher than the audio band (e.g., 2 Hz to 20 kHz) under the ultra-light load condition (<2 mA). As shown in FIG. 1, the on-time timer circuit 126 is arranged to generate an on-time control signal RST for controlling an on-time duration Ton of a switch circuit (e.g., high-side switch circuit) included in the power stage circuit 102. In this embodiment, the on-time control signal RST is supplied to the reset input node (labeled by "R") of the SR latch circuit 112 through the OR gate 128. Hence, the reset input node (labeled by "R") of the SR latch circuit 112 is jointly controlled by the feedback control signal Ipeak_cmp and the on-time control signal RST. For example, when the on-time control signal RST is asserted (i.e., RST=1), the output node of the SR latch circuit 112 is reset by the logic low level (i.e., Q=0) in response to the reset input node of the SR latch circuit 112 being asserted (i.e., R=RST=1). Since the output node of the SR latch circuit 112 is reset to the logic low level (i.e., Q=0), the high-side switch circuit (PMOS transistor M1) is turned off, the low-side switch circuit (NMOS transistor M2) is turned on, and the inductor current I_IND decreases due to the turned-on low-side switch circuit (NMOS transistor M2). To put it simply, the feedback control signal Vout_cmp is used to decide a start time point of the on-time duration Ton of the high-side switch circuit (PMOS transistor M1), and each of the on-time control signal RST and the feedback control signal Ipeak_cmp is used to decide an end time point of the on-time duration Ton of the high-side switch circuit (PMOS transistor M1). When the peak current value VREF_SEN is set by a minimum peak current value (i.e., VREF_SEN=Min IPEAK) which means that the switching frequency $F_{SW}$ can no longer be increased by decreasing the peak current value VREF_SEN, the on-time control signal RST can be adaptively adjusted to achieve the objective of adjusting the switching frequency $F_{SW}$ of the PFM converter 100.

In this embodiment, the on-time control signal RST is adaptively adjusted under control of the detection circuit 124. Specifically, the detection circuit 124 is arranged to control the on-time timer circuit 126 to adaptively adjust the on-time control signal RST according to a pulse interval between two successive inductor current pulses of the PFM converter 100. For example, the detection circuit 124 is arranged to adaptively adjust the selection control signal Ton_SEL according to a pulse interval between two successive inductor current pulses (e.g., on-time pulses) of the PFM converter 100.

Figure 3:
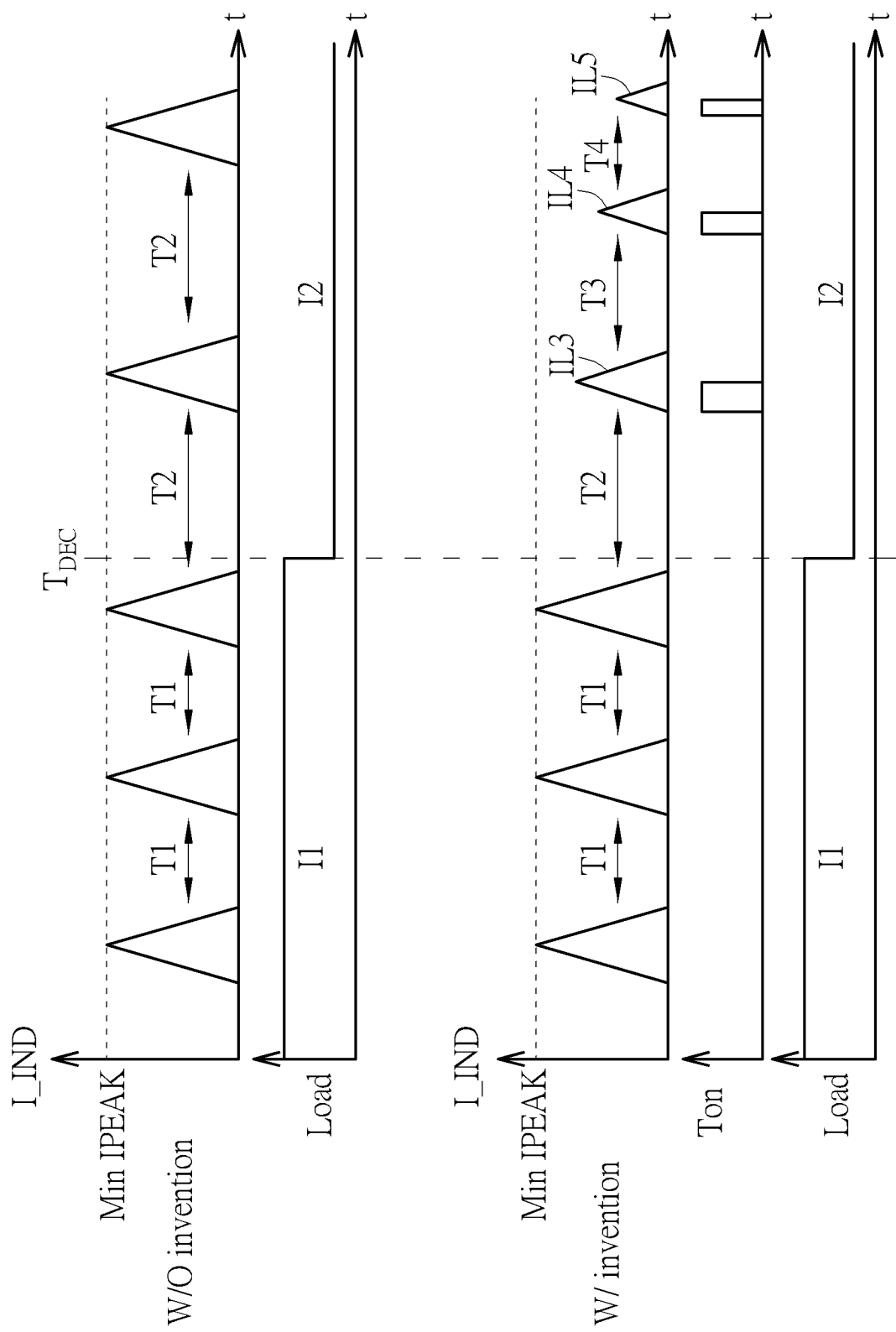
FIG. 3 is a diagram illustrating a concept of adaptively adjusting the on-time control signal according to a pulse interval between two successive inductor current pulses.

FIG. 3 is a diagram illustrating a concept of adaptively adjusting the on-time control signal RST according to a pulse interval between two successive inductor current pulses. Specifically, FIG. 3 shows a comparison between inductor current characteristics of the typical PFM converter without using the invention (top part) and inductor current characteristics of the proposed PFM converter 100 using the invention (bottom part) under a load decrease scenario.

As shown in the top part of FIG. 3, after the load decreases from I1 to I2 at the time point $T_{DEC}$ while the minimum peak current value Min IPEAK is used, the typical PFM converter makes a switching period (i.e., a pulse interval between successive inductor current pulses) changed from a current value T1 to a larger value T2 (i.e., T2>T1), thereby reducing the switching frequency. As a result, it is possible that an audio band (e.g., 2 Hz to 20 kHz) is interfered with the noise caused by the lower switching frequency of the typical PFM converter. Since the minimum peak current value Min IPEAK is already used, reducing the peak current value for increasing the switching frequency is not feasible.

As shown in the bottom part of FIG. 3, after the load decreases from I1 to I2 at the time point $T_{DEC}$ while the minimum peak current value Min IPEAK is used, the proposed PFM converter 100 with the detection circuit 124 finds that a start time point of the inductor current pulse IL3 is later than a timing threshold (i.e., the pulse interval T2 is larger than a pre-defined interval). The detection circuit 124 instructs the on-time timer circuit 126 to adjust the on-time control signal RST for making the high-side switch circuit (PMOS transistor M1) to have a shorter on-time duration Ton (e.g., Ton=Ton_1), such that the switching frequency is increased. If the proposed PFM converter 100 with the detection circuit 124 finds that a start time point of the next inductor current pulse IL4 is still later than the timing threshold (i.e., the pulse interval T3 (T3<T2) is larger than the pre-defined interval), the detection circuit 124 instructs the on-time timer circuit 126 to adjust the on-time control signal RST for making the high-side switch circuit (PMOS transistor M1) to have a shorter on-time duration Ton (e.g., Ton=Ton_2<Ton_1), such that the switching frequency is increased. If the proposed PFM converter 100 with the detection circuit 124 finds that a start time point of the next inductor current pulse IL5 is still later than a timing threshold (i.e., the pulse interval T4 (T4<T3) is larger than the pre-defined interval), the detection circuit 124 instructs the on-time timer circuit 126 to adjust the on-time control signal RST for making the high-side switch circuit (PMOS transistor M1) to have a shorter on-time duration Ton (e.g., Ton=Ton_3<Ton_2), such that the switching frequency is increased. The on-time timer circuit 126 adjusts the on-time control signal RST to increase the switch frequency until a minimum on-time duration Ton is used or the switching frequency $F_{SW}$ is higher than a desired value (e.g., 20 kHz), thereby preventing the switching frequency of the PFM converter 100 from interfering with the audio band (e.g., 2 Hz to 20 kHz) or radio frequency.

In this embodiment, the on-time timer circuit 126 may be implemented using a digital-to-time converter (DTC) that is arranged to receive the digital control word Ton_SEL from the detection circuit 124, and convert the digital control word Ton_SEL into the on-time control signal RST. The detection circuit 124 may include a frequency generator circuit (labeled by "Freq Gen") 130 and a counter circuit (labeled by "CNT") 132, where the frequency generator circuit 130 is arranged to generate a first timing threshold signal FT1 and a second timing threshold signal FT2 according to a clock signal CK, and the counter circuit 132 is arranged to generate a counter value as the digital control word Ton_SEL according to the first timing threshold signal FT1 and the second timing threshold signal FT2, where an edge of the first timing threshold signal FT1 is indicative of a first switching frequency FH, and an edge of the second timing threshold signal FT2 is indicative of a second switching frequency FL (FH>FL). Further details of the frequency generator circuit 130 are described as below.

Figure 4:
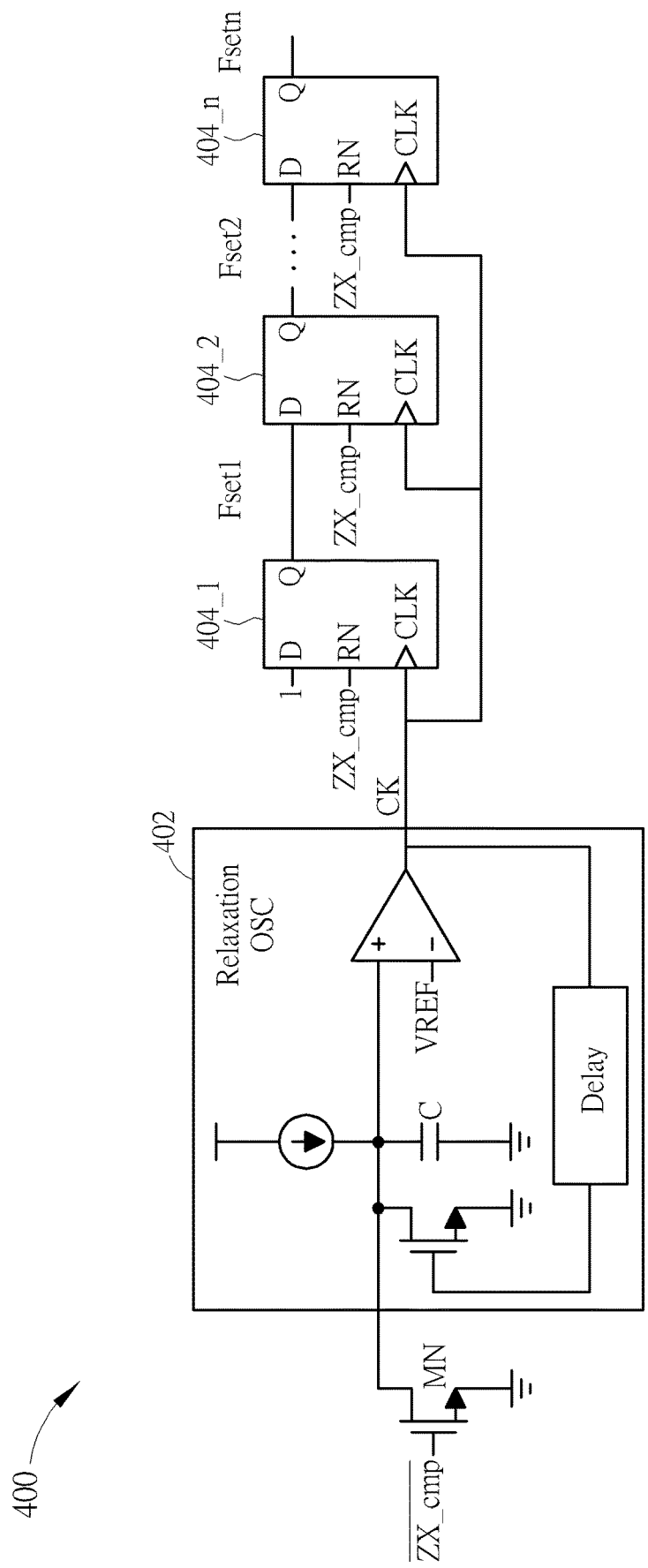
FIG. 4 is a diagram illustrating a frequency generator circuit according to an embodiment of the present invention.

FIG. 4 is a diagram illustrating a frequency generator circuit according to an embodiment of the present invention. The frequency generator circuit 130 shown in FIG. 1 may be implemented using the frequency generator circuit 400 shown in FIG. 4. The frequency generator circuit 400 includes an NMOS transistor MN, an oscillator (OSC) circuit (e.g., a relaxation OSC 402), and a plurality of D-type flip-flops (DFFs) 404_1-404_n (n≥2). As mentioned above, when the feedback control signal ZX_cmp has a transition from the logic low level (i.e., ZX_cmp=0) to the logic high level (i.e., ZX_cmp=1), the output signal LG is reset by the logic low level (i.e., LG=0), where the output signal $\overline{UG}$ remains at the logic high level (i.e., $\overline{UG}$=1). Hence, the high-side switch circuit (PMOS transistor M1) and the low-side switch circuit (NMOS transistor M2) are both turned off. A low-to-high transition of the feedback control signal ZX_cmp indicates an end time point of one inductor current pulse (which is a start time point of a pulse interval between the current inductor current pulse and the next current pulse), and can serve as an enable signal of the pulse interval detection. During a period in which the feedback control signal ZX_cmp has the logic low level (i.e., ZX_cmp=0), the NMOS transistor MN is turned on to discharge the capacitor C of the relaxation OSC 402, and the relaxation OSC 402 is disabled. When the feedback control signal ZX_cmp has a transition from the logic low level (i.e., ZX_cmp=0) to the logic high level (i.e., ZX_cmp=1), the NMOS transistor MN is turned off, and the relaxation OSC 402 is enabled to start the generation of the clock signal CK.

Each of the DFFs 404_1-404_n includes a data input node (labeled by "D"), a data output node (labeled by "Q"), a reset input node (labeled by "RN"), and a clock input node (labeled by "CLK"). In this embodiment, the DFFs 404_1-404_n are cascaded and clocked by the clock signal CK generated from the relaxation OSC 402. Furthermore, a pre-defined value "1" is fed into the data input node of the frontmost flip-flip circuit 404_1. The operation of each of the DFF 404_1-404_n may be represented by the following truth table, but the present invention is not limited thereto.

| RN | CLK | D | Q |
|---|---|---|---|
| 1 | ↑ | 0 | 0 |
| 1 | ↑ | 1 | 1 |
| 0 | — | — | 0 |

During a period in which the feedback control signal ZX_cmp has the logic low level (i.e., ZX_cmp=0), all of the DFFs 404_1-404_n are reset (Q=0). Since the DFFs 404_1-404_n are cascaded and clocked by the clock signal CK, the pre-defined value "1" will be propagated through the cascaded DFFs 404_1-404_n after the relaxation OSC 402 is enabled due to ZX_cmp=1.

Suppose that the feedback control signal ZX_cmp has a transition from the logic low level (i.e., ZX_cmp=0) to the logic high level (i.e., ZX_cmp=1) at $T_{ZX\_cmp}$ (N) (i.e., the former inductor current pulse of two successive inductor current pulses ends at $T_{ZX\_cmp}$ (N)), and has a next transition from the logic low level (i.e., ZX_cmp=0) to the logic high level (i.e., ZX_cmp=1) at $T_{ZX\_cmp}$ (N+1) (i.e., the later inductor current pulse of two successive inductor current pulses ends at $T_{ZX\_cmp}$ (N+1)); and a period of the clock signal CK is equal to $T_{CK}$. If $T_{ZX\_cmp}$ (N)+1*$T_{CK}$<$T_{ZX\_cmp}$ (N+1), the timing threshold signal Fset1 generated at the data output node of the DFF 404_1 has a transition from the logic low level (i.e., Fset1=0) to the logic high level (i.e., Fset1=1) at $T_{ZX\_cmp}$ (N)+1*$T_{CK}$, and holds the logic high level (i.e., Fset1=1) until it is reset at ZX_cmp=0 (i.e., a time point when the inductor current I_IND reaches the peak current value). If $T_{ZX\_cmp}$ (N)+2*$T_{CK}$<$T_{ZX\_cmp}$ (N+1), the timing threshold signal Fset2 generated at the data output node of the DFF 404_2 has a transition from the logic low level (i.e., Fset2=0) to the logic high level (i.e., Fset2=1) at $T_{ZX\_cmp}$ (N)+2*$T_{CK}$, and holds the logic high level (i.e., Fset2=1) until it is reset at ZX_cmp=0 (i.e., a time point when the inductor current I_IND reaches the peak current value). If $T_{ZX\_cmp}$ (N)+n*$T_{CK}$<$T_{ZX\_cmp}$ (N+1), the timing threshold signal Fsetn generated at the data output node of the DFF 404_n has a transition from the logic low level (i.e., Fsetn=0) to the logic high level (i.e., Fsetn=1) at $T_{ZX\_cmp}$ (N)+n*$T_{CK}$, and holds the logic high level (i.e., Fsetn=1) until it is reset at ZX_cmp=0 (i.e., a time point when the inductor current I_IND reaches the peak current value).

The timing threshold signals Fset1-Fsetn can be used to detect different switching frequencies. Suppose that the frequency of the clock signal CK is set by FREF. The timing threshold signal Fset1 can be used to detect the switching frequency FREF. The timing threshold signal Fset2 can be used to detect the switching frequency FREF/2. The timing threshold signal Fsetn can be used to detect the switching frequency FREF/n. As mentioned above, the frequency generator circuit 130 provides the first timing threshold signal FT1 and the second timing threshold signal FT2 for pulse interval detection. For example, the timing threshold signal Fset1 generated by the frequency generator circuit 400 may be selected as the first timing threshold signal FT1, and the timing threshold signal Fset2 generated by the frequency generator circuit 400 may be selected as the second timing threshold signal FT2. When the frequency of the clock signal CK generated from the relaxation OSC 402 is 50 KHz, an edge of the first timing threshold signal FT1 (FT1=Fset1) is indicative of the first switching frequency FH being 50 kHz, and an edge of the second timing threshold signal FT2 (FT2=Fset2) is indicative of the second switching frequency FL being 25 KHz. However, this is for illustrative purposes only, and is not meant to be a limitation of the present invention. In practice, the first timing threshold signal FT1 and the second timing threshold signal FT2 can be selected from the timing threshold signals Fset1-Fsetn according to application requirements and design considerations.

Figure 5:
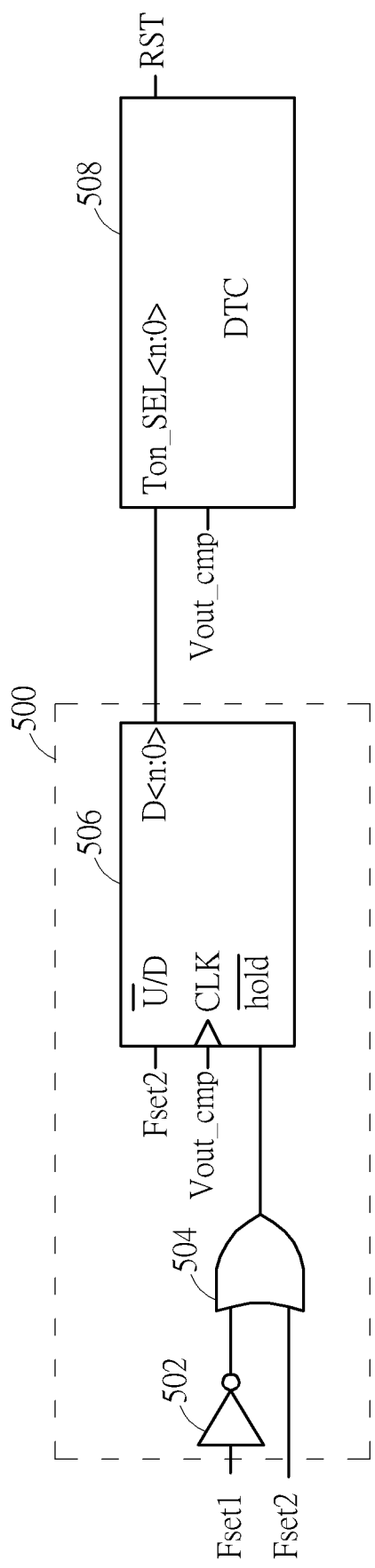
FIG. 5 is a diagram illustrating a counter circuit and an on-time timer circuit according to an embodiment of the present invention.

The counter 132 shown in FIG. 1 is capable of adaptively updating its counter value according to a result of the pulse interval detection that is based on the first timing threshold signal FT1 and the second timing threshold signal FT2 provided by the frequency generator circuit 130. FIG. 5 is a diagram illustrating a counter circuit and an on-time timer circuit according to an embodiment of the present invention. The counter circuit 132 shown in FIG. 1 may be implemented using the counter circuit 500 shown in FIG. 5, and the on-time timer circuit may be implemented using the on-time timer circuit (e.g., DTC 508) shown in FIG. 5.

The counter circuit 500 includes a NOT gate (also known as an inverter) 502, an OR gate 504, and a counter 506. In this embodiment, the timing threshold signal Fset1 is selected as the first timing threshold signal FT1, and the timing threshold signal Fset2 is selected as the second timing threshold signal FT2. The operation of the counter 506 may be represented by the following truth table, but the present invention is not limited thereto.

| $\overline{hold}$ | CLK | U/D | D <n: 0> |
|---|---|---|---|
| 0 | ↑ | — | No change |
| 1 | ↑ | 1 | −1 |
| 1 | ↑ | 0 | +1 |

The clock input node (labeled by "CLK") of the counter 506 is arranged to receive the feedback control signal Vout_cmp. As mentioned above, when the output voltage VOUT drops below the reference voltage VREF (i.e., VOUT<VREF), the feedback control signal Vout_cmp is set by the logic high level (i.e., Vout_cmp=1). Hence, the output node of the SR latch circuit 112 is set by the logic high level (i.e., Q=1) in response to the set input node of the SR latch circuit 112 being asserted (i.e., S=Vout_cmp=1), and the high-side switch circuit (PMOS transistor M1) is turned on. A low-to-high transition of the feedback control signal Vout_cmp indicates a start time point of each inductor current pulse (which is also an end time point of a pulse interval between two successive inductor current pulses). Hence, when the feedback control signal Vout_cmp has a transition from the logic low level (i.e., Vout_cmp=0) to the logic high level (i.e., Vout_cmp=1), the counter 506 is trigged to determine whether to adjust the counter value D<n:0>.

In this embodiment, the $\overline{hold}$ signal is set by ORing $\overline{Fset1}$ and Fset2. In a case where the timing threshold signals Fset1 and Fset2 have different logic levels (i.e., $\overline{hold}$=0) at a start time point of the later inductor current pulse in the two successive inductor current pulses (i.e., at the time the feedback control signal Vout_cmp has a transition from the logic low level (i.e., Vout_cmp=0) to the logic high level (i.e., Vout_cmp=1)), the counter 506 holds a previous counter value D<n:0> as a current counter value D<n:0>, such that the same on-time control signal RST is generated due to no change made to the counter value D<n:0>.

In another case where the timing threshold signals Fset1 and Fset2 have the same logic level (i.e., $\overline{hold}$=1) at a start time point of the later inductor current pulse in the two successive inductor current pulses (i.e., at the time the feedback control signal Vout_cmp has a transition from the logic low level (i.e., Vout_cmp=0) to the logic high level (i.e., Vout_cmp=1)), the counter 506 adjusts the counter value D<n:1> by an adjustment value that is decided by a logic level of the timing threshold signal Fset2. For example, when both of the timing threshold signals Fset1 and Fset2 have the same logic low level "0" at the start time point of the later inductor current pulse in the two successive inductor current pulses (i.e., at the time the feedback control signal Vout_cmp has a transition from the logic low level (i.e., Vout_cmp=0) to the logic high level (i.e., Vout_cmp=1)), the counter 506 selects an increment value "+1" as the adjustment value, such that D<n:1>=D<n:1>+1.

For another example, when both of the timing threshold signals Fset1 and Fset2 have the same logic high level "1" at the start time point of the later inductor current pulse in the two successive inductor current pulses (i.e., at the time the feedback control signal Vout_cmp has a transition from the logic low level (i.e., Vout_cmp=0) to the logic high level (i.e., Vout_cmp=1)), the counter 506 selects a decrement value "−1" as the adjustment value, such that D<n:1>=D<n:1>−1.

The counter 506 outputs the counter value D<n: 1> as a digital control word Ton_SEL<n:1> of the DTC 508 (which acts as an on-time timer circuit). In this embodiment, the feedback control signal Vout_cmp may act as a clock input of the DTC 508. The DTC 508 is arranged to perform digital-to-time conversion upon the digital control word Ton_SEL<n: 1> to generate the on-time control signal RST. More specifically, different digital values of the digital control word Ton_SEL<n: 1> correspond to different on-time control settings (i.e., reset timing settings). When the digital control word Ton_SEL<n: 1> is increased by the increment value "+1", the on-time control signal RST has a delayed transition from the logic low level (i.e., RST=0) to the logic high level (i.e., RST=1), thereby increasing the on-time duration Ton of the high-side switch circuit (PMOS transistor M1) in the power stage circuit 102. When the digital control word Ton_SEL<n: 1> is decreased by the decrement value "−1", the on-time control signal RST has an advanced transition from the logic low level (i.e., RST=0) to the logic high level (i.e., RST=1), thereby decreasing the on-time duration Ton of the high-side switch circuit (PMOS transistor M1) included in the power stage circuit 102.

In accordance with the proposed on-time control scheme, when the pulse interval is longer than a first pre-defined interval, the on-time duration Ton of the high-side switch circuit (PMOS transistor M1) controlled by the on-time control signal RST with a current on-time control setting is shorter than the on-time duration Ton of the high-side switch circuit (PMOS transistor M1) controlled by the on-time control signal RST with a previous on-time control setting; when the pulse interval is shorter than a second pre-defined interval (which is shorter than the first pre-defined interval), the on-time duration Ton of the high-side switch circuit (PMOS transistor M1) controlled by the on-time control signal RST with a current on-time control setting is longer than the on-time duration Ton of the high-side switch circuit (PMOS transistor M1) controlled by the on-time control signal RST with a previous on-time control setting; and when the pulse interval is between the first pre-defined interval and the second pre-defined interval, the on-time duration Ton of the high-side switch circuit (PMOS transistor M1) controlled by the on-time control signal RST with a current on-time control setting is the same as the on-time duration Ton of the high-side switch circuit (PMOS transistor M1) controlled by the on-time control signal RST with a previous on-time control setting, where the previous on-time control setting is the same as the current on-time control setting.

Figure 6:
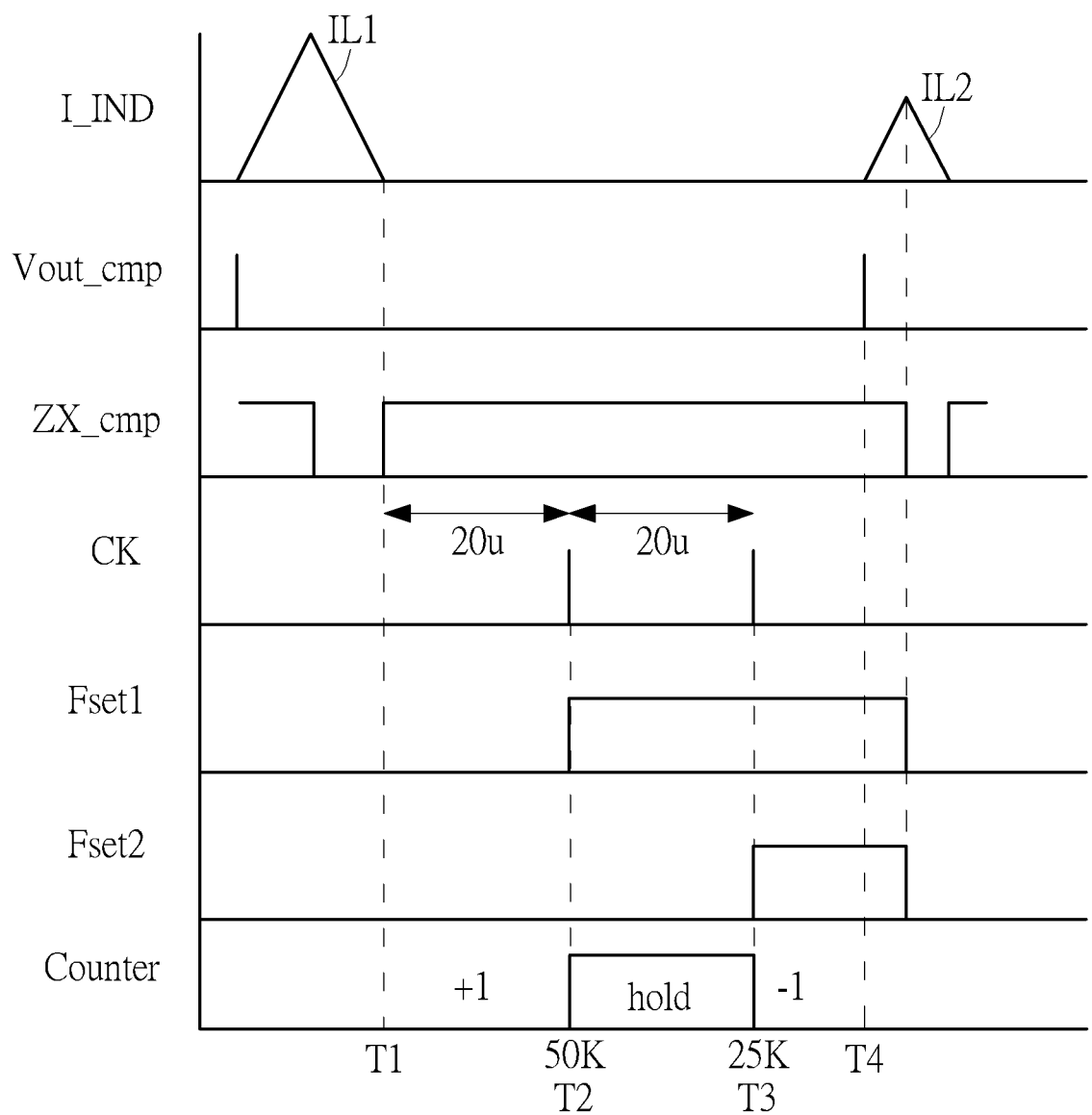
FIG. 6 is a timing diagram illustrating an operation of the proposed on-time control scheme under a case where the switching frequency is lower than 25 kHz.

FIG. 6 is a timing diagram illustrating an operation of the proposed on-time control scheme under a case where the switching frequency $F_{SW}$ is lower than 25 kHz. Assume that the frequency of the clock signal CK is 50 kHz, the first timing threshold signal FT1 is set by the timing threshold signal Fset1, and the second timing threshold signal FT2 is set by the timing threshold signal Fset2. The period $T_{CK}$ of the clock signal CK is equal to 20 microsecond (us). The former inductor current pulse IL1 of two successive inductor current pulses ends at a time point T1 as indicated by a low-to-high transition of the feedback control signal ZX_cmp. The timing threshold signal Fset1 has a low-to-high transition at a time point T2 (T2=T1+20 us). The timing threshold signal Fset2 has a low-to-high transition at a time point T3 (T3=T2+20 us=T1+40 us). The later inductor current pulse IL2 of two successive inductor current pulses starts at a time point T4 as indicated by a low-to-high transition of the feedback control signal Vout_cmp.

Since the time point T4 is later than the time point T3, the pulse interval between two successive inductor current pulses IL1 and IL2 is longer than a pre-defined interval (i.e., an interval that corresponds to $F_{SW}$=25 kHz). As shown in FIG. 6, the timing threshold signal Fset2 has a logic high level "1" at the time point T4. Hence, the counter value is updated by a decrement value "−1" for decreasing the on-time duration Ton of the high-side switch circuit (PMOS transistor M1) in the power stage circuit 102. In this way, the switching frequency $F_{SW}$ is increased due to the decreased on-time duration Ton.

Figure 7:
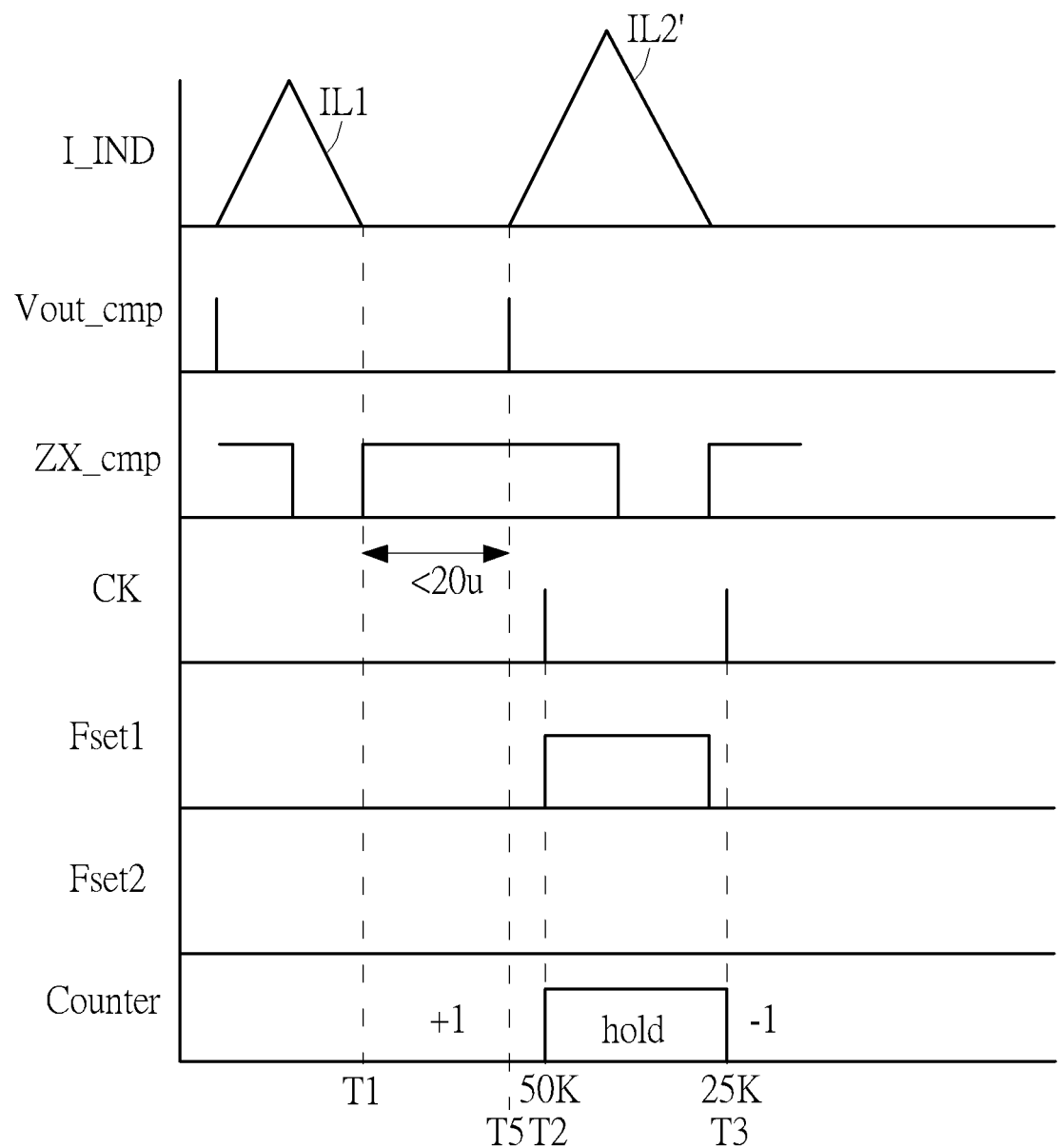
FIG. 7 is a timing diagram illustrating an operation of the proposed on-time control scheme under a case where the switching frequency is higher than 50 kHz.

FIG. 7 is a timing diagram illustrating an operation of the proposed on-time control scheme under a case where the switching frequency $F_{SW}$ is higher than 50 kHz. Assume that the frequency of the clock signal CK is 50 kHz, the first timing threshold signal FT1 is set by the timing threshold signal Fset1, and the second timing threshold signal FT2 is set by the timing threshold signal Fset2. The period $T_{CK}$ of the clock signal CK is equal to 20 us. The former inductor current pulse IL1 of two successive inductor current pulses ends at a time point T1 as indicated by a low-to-high transition of the feedback control signal ZX_cmp. The later inductor current pulse IL2' of two successive inductor current pulses starts at a time point T5 as indicated by a low-to-high transition of the feedback control signal Vout_cmp. Both of the timing threshold signals Fset1 and Fset2 have the same logic low level "0" at the time point T5. Since the time point T5 is earlier than the time point T2, the pulse interval between two successive inductor current pulses IL1 and IL2' is shorter than another pre-defined interval (i.e., an interval that corresponds to $F_{SW}$=50 kHz). Since the timing threshold signal Fset2 has the logic low level "0" at the time point T5, the counter value is updated by an increment value "+1" for increasing the on-time duration Ton of the high-side switch circuit (PMOS transistor M1) in the power stage circuit 102. In this way, the switching frequency $F_{SW}$ is decreased due to the increased on-time duration Ton.

It should be noted that if the later inductor current pulse of two successive inductor current pulses starts at a time point between two time points T2 and T3, the counter value is kept unchanged. In this way, the switching frequency $F_{SW}$ does not change due to the fact that the on-time duration Ton remains unchanged.

The timing threshold signals Fset1 and Fset2 define timing thresholds associated with different switching frequencies, respectively. The counter value may be adjusted by "+1" or "−1" in one pulse interval detection performed for each pulse interval between two successive inductor current pulses. Hence, the on-time duration Ton may be gradually adjusted until the switching frequency $F_{SW}$ falls within a frequency range (e.g., [25 kHz-50 kHz]) having timing thresholds defined by the timing threshold signals Fset1 and Fset2. To put it simply, when the switching frequency $F_{SW}$ is beyond the frequency range (e.g., [25 kHz-50 KHz]) due to certain factors, the proposed on-time control scheme implemented in a PFM converter under an ultra-light load condition (<2 mA) can make the switching frequency $F_{SW}$ fall within the frequency range (e.g., [25 kHz-50 KHz]) again by adaptively adjusting the on-time duration Ton through the on-time control signal RST. Since the switching frequency $F_{SW}$ will reach the frequency range (e.g., [25 kHz-50 KHz]) after several Ton adjustments applied by the proposed on-time control scheme, the proposed on-time control scheme does not need to calibrate the Ton adjustment determined by each pulse interval detection, and the function of the proposed on-time control scheme can work normally under process, voltage, temperature variation.

Figure 8:
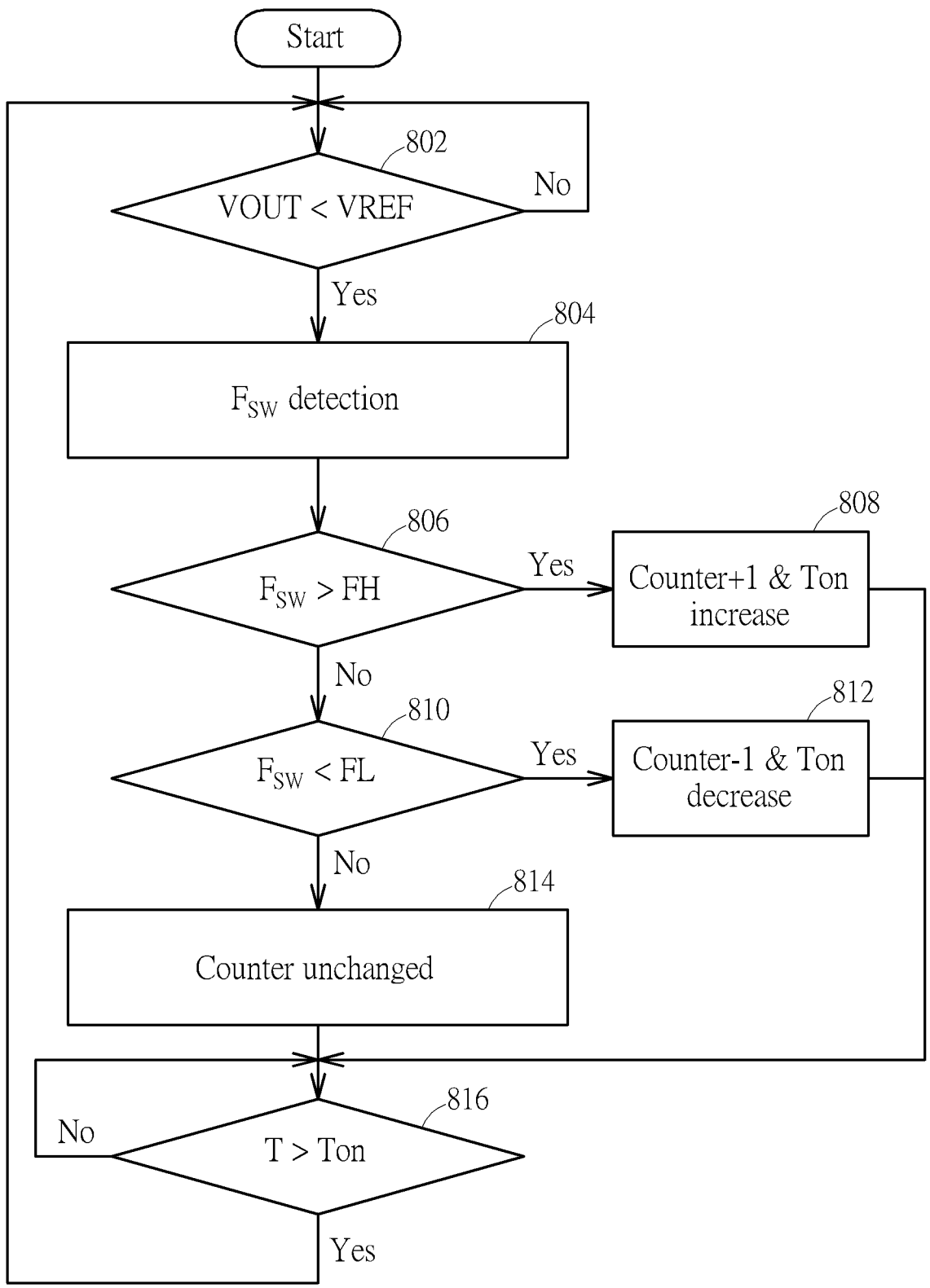
FIG. 8 is a flowchart illustrating an operation of the proposed on-time control scheme implemented in a PFM modulation according to an embodiment of the present invention.

The operation of the proposed on-time control scheme implemented in a PFM converter under an ultra-light load condition (<2 mA) can be briefly summarized by the flowchart shown in FIG. 8. Provided that the result is substantially the same, the steps are not required to be executed in the exact order shown in FIG. 8. At step 802, the detection circuit 124 checks the feedback control signal Vout_cmp to determine when to do the final judgment of the pulse interval detection (i.e., $F_{SW}$ detection). It should be noted that the pulse interval detection (i.e., $F_{SW}$ detection) may start at the end of the former inductor current pulse of two successive inductor current pulses. When the output voltage VOUT is lower than the reference voltage VREF, the later inductor current pulse of two successive inductor current pulses starts, and the detection circuit 124 judges if a pulse interval between two successive inductor current pulses is shorter than a first pre-defined interval (which corresponds to the first switching frequency FH), or longer than a second pre-defined interval (which corresponds to the second switching frequency FL), or between the first pre-defined interval and the second pre-defined interval (step 804). When the pulse interval between two successive inductor current pulses is shorter than the first pre-defined interval, the counter value is increased for increasing the on-time duration Ton (steps 806 and 808). When the pulse interval between two successive inductor current pulses is longer than the second pre-defined interval, the counter value is decreased for decreasing the on-time duration Ton (steps 810 and 812). When the pulse interval between two successive inductor current pulses is between the first pre-defined interval and the second pre-defined interval, the counter value is kept unchanged. After the high-side switch circuit (PMOS transistor M1) included in the power stage circuit 102 is turned off due to expiration of the on-time duration Ton (i.e., T>Ton) (step 816), the flow returns to step 802 to wait for next pulse interval detection (i.e., $F_{SW}$ detection).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A feedback control circuit of a pulse-frequency modulation (PFM) converter, comprising:
   an on-time timer circuit, arranged to generate an on-time control signal for controlling an on-time duration of a switch circuit included in a power stage circuit of the PFM converter; and
   a detection circuit, arranged to control the on-time timer circuit to adaptively adjust an on-time duration of the on-time control signal according to a change in a pulse interval between two successive inductor current pulses of the PFM converter.

2. The feedback control circuit of claim 1, wherein the detection circuit is arranged to control the on-time timer circuit to select a current on-time control setting for generating the on-time control signal when detecting that the pulse interval is longer than a pre-defined interval, where the on-time duration of the switch circuit controlled by the on-time control signal with the current on-time control setting is shorter than the on-time duration of the switch circuit controlled by the on-time control signal with a previous on-time control setting.

3. The feedback control circuit of claim 1, wherein the detection circuit is arranged to control the on-time timer circuit to select a current on-time control setting for generating the on-time control signal when detecting that the pulse interval is shorter than a pre-defined interval, where the on-time duration of the switch circuit controlled by the on-time control signal with the current on-time control setting is longer than the on-time duration of the switch circuit controlled by the on-time control signal with a previous on-time control setting.

4. The feedback control circuit of claim 1, wherein the detection circuit is arranged to control the on-time timer circuit to hold a previous on-time control setting as a current on-time control setting for generating the on-time control signal when detecting that the pulse interval is between a first pre-defined interval and a second pre-defined interval.

5. The feedback control circuit of claim 1, wherein the detection circuit is arranged to adaptively adjust a digital control word according to the pulse interval between two successive inductor current pulses of the PFM converter, and the on-time timer circuit comprises:

a digital-to-time converter, arranged to receive the digital control word from the detection circuit, and convert the digital control word into the on-time control signal.

6. The feedback control circuit of claim 5, wherein the detection circuit comprises:

a frequency generator circuit, arranged to generate a first timing threshold signal and a second timing threshold signal according to a clock signal; and a counter circuit, arranged to generate a counter value as the digital control word according to the first timing threshold signal and the second timing threshold signal.

7. The feedback control circuit of claim 6, wherein both of the first timing threshold signal and the second timing threshold signal have a same logic level at a start time point of a later inductor current pulse in the two successive inductor current pulses, and the counter circuit adjusts the counter value by an adjustment value.

8. The feedback control circuit of claim 7, wherein when both of the first timing threshold signal and the second timing threshold signal have a first logic level at the start time point of the later inductor current pulse in the two successive inductor current pulses, the counter circuit selects an increment value as the adjustment value; and when both of the first timing threshold signal and the second timing threshold signal have a second logic level at the start time point of the later inductor current pulse in the two successive inductor current pulses, the counter circuit selects a decrement value as the adjustment value.

9. The feedback control circuit of claim 6, wherein the first timing threshold signal and the second timing threshold signal have different logic levels at a start time point of a later inductor current pulse in the two successive inductor current pulses, and the counter circuit holds the counter value.

10. The feedback control circuit of claim 6, wherein the frequency generator circuit comprises:

an oscillator circuit, arranged to generate the clock signal; and a plurality of cascaded flip-flip circuits, wherein the plurality of cascaded flip-flip circuits are clocked by the clock signal, a pre-defined value is fed into a data input node of a frontmost flip-flip circuit of the plurality of cascaded flip-flip circuits, and the first timing threshold signal and the second timing threshold signal are output from data output nodes of different flip-flip circuits included in the plurality of cascaded flip-flip circuits.

* * * * *